US008950719B2

(12) United States Patent
Ciccaglione et al.

(10) Patent No.: US 8,950,719 B2
(45) Date of Patent: Feb. 10, 2015

(54) INTEGRATED RACK INSTALLATION APPARATUS AND METHOD

(75) Inventors: Terry M. Ciccaglione, Cold Spring, NY (US); Charles C. Gange, Rhinebeck, NY (US); Sharon T. Spaulding, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 214 days.

(21) Appl. No.: 13/356,772

(22) Filed: Jan. 24, 2012

(65) Prior Publication Data

US 2013/0186842 A1      Jul. 25, 2013

(51) Int. Cl.
*A47B 91/00*         (2006.01)
*A47G 29/00*         (2006.01)
*B65D 19/00*         (2006.01)

(52) U.S. Cl.
USPC .................................. 248/346.01; 248/346.03

(58) Field of Classification Search
USPC ................ 248/346.01, 346.03; 446/108, 444; 177/145
See application file for complete search history.

(56) References Cited

U.S. PATENT DOCUMENTS

| 2005/0287905 | A1* | 12/2005 | Olivier | 446/108 |
| 2007/0298679 | A1* | 12/2007 | Perego | 446/444 |
| 2010/0129186 | A1* | 5/2010 | Foote et al. | 414/495 |

* cited by examiner

*Primary Examiner* — Amy J Sterling
(74) *Attorney, Agent, or Firm* — Cantor Colburn LLP; Steven Chiu

(57) ABSTRACT

According to one embodiment of the present invention, an integrated installation apparatus to receive an electronics rack in a data center method is provided having a mat comprising a hard material to protect a floor surface beneath the mat, wherein the mat has a key feature to couple to a key feature of an adjacent mat. The apparatus also has a guide coupled to the mat to receive a rolling member supporting the electronics rack and a weight distribution structure configured to distribute a weight from feet that support the electronics rack to the mat.

8 Claims, 5 Drawing Sheets

INTEGRATED RACK INSTALLATION APPARATUS AND METHOD

BACKGROUND

The present invention relates to an apparatus and method for rack installation, and more specifically, to an apparatus for rack installation with integrated guidance, protective and weight distribution features.

Electronic equipment, such as computers or servers, may be installed in racks to provide modularity and flexibility in an organized and compact assembly. For example, data centers may have hundreds of racks arranged within large rooms, where several servers may be mounted in each rack. The racks may be organized in rows and arranged closely to one another to utilize available floor space. Thus, installing and moving the racks may be a complex task. The racks, including electronics hardware, may be very heavy, making movement and installation of the racks more difficult.

In some cases, the racks may have to be arranged and installed in a certain order due to space and/or wiring constraints. For example, in a situation where six racks are to be installed in a row adjacent to one another, the first and second racks are installed in the first and sixth positions in the row in a first step. The remaining racks are installed in similar fashion, where the third and fourth positions (i.e., most central positions) in the row are installed last. For data centers where the racks are to be tightly arranged and spaced a small distance apart, an outer rack placement that is misplaced by a small amount may adversely affect a subsequent rack installation at the row's center. After placement of the rack on the floor, feet may be used to support the racks, where the weight of the racks may cause damage to the floor due to the concentrated load from the feet to the floor.

SUMMARY

According to one embodiment of the present invention, an integrated installation apparatus to receive an electronics rack in a data center method is provided having a mat including a hard material to protect a floor surface beneath the mat, wherein the mat has a key feature to couple to a key feature of an adjacent mat. The apparatus also has a guide coupled to the mat to receive a rolling member supporting the electronics rack and a weight distribution structure configured to distribute a weight from feet that support the electronics rack to the mat.

According to one embodiment of the present invention, a method is provided, where the method includes providing a mat including a hard material to protect a floor surface beneath the mat, wherein the mat has a key feature to couple to a key feature of an adjacent mat. The method also includes providing a guide coupled to the mat and providing a weight distribution structure coupled to the mat. The method further includes receiving a rolling member supporting the electronics rack in the guide and distributing a weight of the electronics rack received from feet that support the electronics rack via the weight distribution structure.

According to one embodiment of the present invention, an electronics rack installation system is provided having a first mat including a hard material to protect a floor surface beneath the mat, wherein the first mat has a first key feature and a first pair of guides coupled to the first mat to receive rolling members supporting a first electronics rack. The system also has a second mat including a hard material to protect the floor surface beneath the mat, wherein the second mat has a second key feature that couples to the first key feature when placed adjacent to the first mat and a second pair of guides coupled to the second mat to receive rolling members supporting a second electronics rack adjacent to the first electronics rack.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Large racks of electronic equipment, such as server racks, are difficult and awkward to move, but are often positioned in close proximity to one another to efficiently utilize floor space. For example, data centers have rooms with dozens of server racks arranged in rows within where the racks are positioned adjacent to one another. Properly aligning and spacing the racks during installation and replacement can be challenging. In an embodiment, an integrated electronics rack installation apparatus improves accuracy of rack positioning to enhance installation efficiency while also protecting adjacent racks and the floor beneath the installation apparatus.

Installing the racks on elevated floors of the data center room may involve temporarily arranging a path of protective sheets on the floor for rolling of the racks to the desired location in the room. The racks typically include rolling members, such as casters, that support the racks to enable movement. In some cases, the rolling members are elevated or removed after the rack is positioned and the racks are supported by feet at the rack's base. The protective sheets protect the elevated floors from damage as the heavy racks, weighing up to 8,000 pounds, are rolled across the floor. It is also desirable to position the racks in a manner that distributes the rack weight across the floor surface to reduce impact on the floor. Once the rack is at the final location for installation, it is desirable to align and properly space the rack relative to other racks to ensure uniformity and optimal utilization of floor space. Further, in some cases the racks are not installed in a consecutive fashion, rather, the racks are installed from the outside inward along a row. This installation technique requires precision and uniformity when positioning the racks to ensure proper space is provided for the innermost (center) racks. Further, when installing and removing the racks from the tight space between other racks, it is desirable to maintain control of the racks to prevent damage to adjacent racks. Embodiments simplify the rack installation process by providing a single apparatus to be placed on a desired floor location that enables precise rack positioning using guide features, protects equipment (i.e., adjacent racks), protects the floor with a durable mat and also allows for proper weight (i.e., load) distribution via a support structure.

Figure 1:
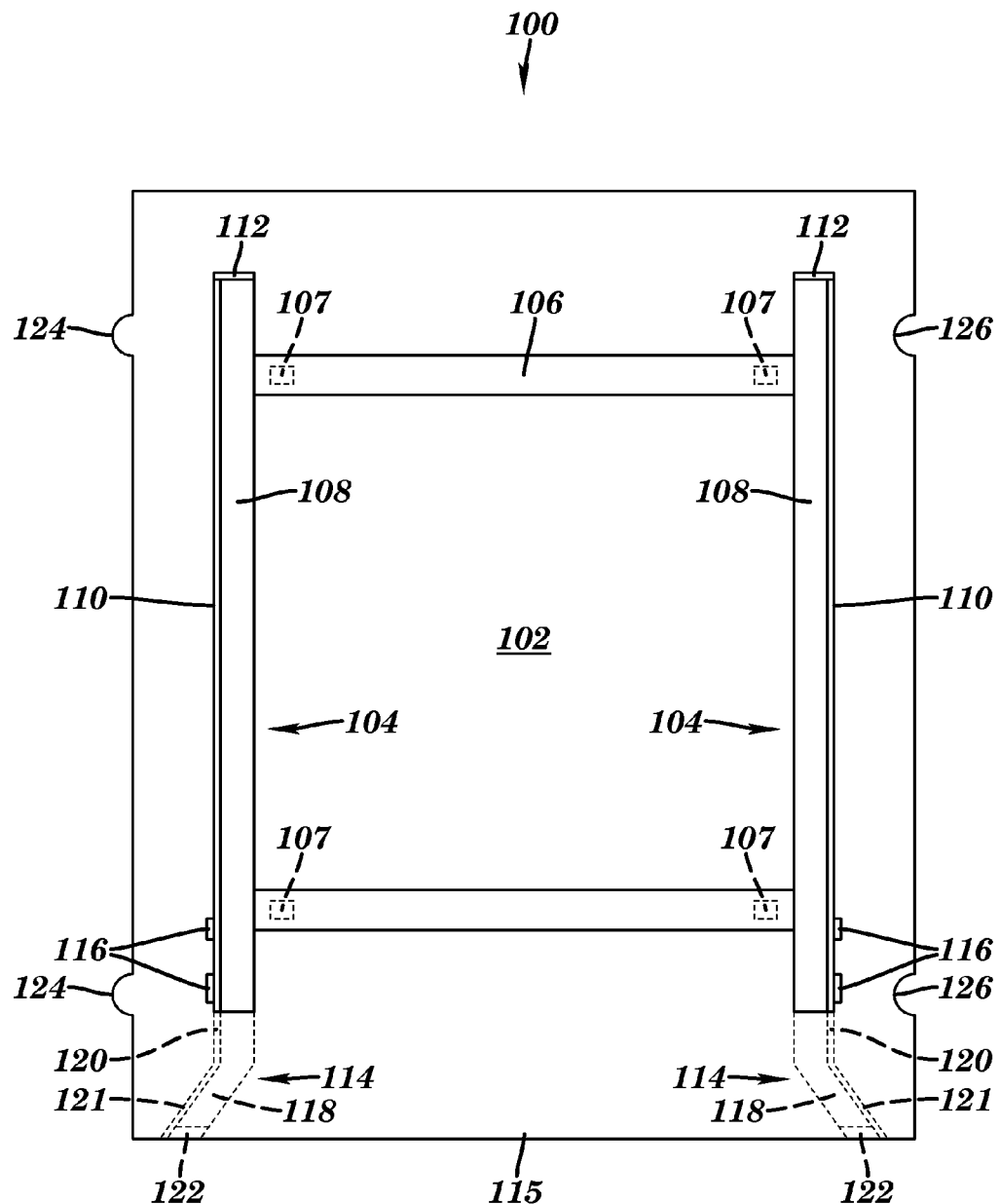
FIG. 1 is a top view of an integrated installation apparatus in accordance with an embodiment of the invention.
Figure 2:
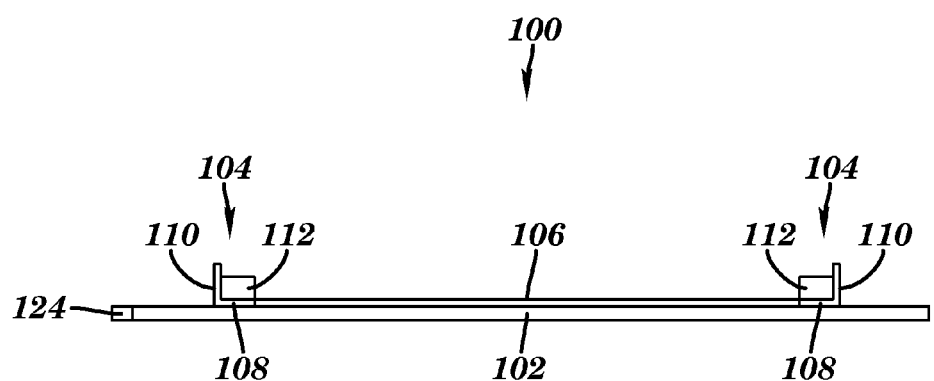
FIG. 2 is a side view of the integrated installation apparatus of FIG. 1.

With reference now to FIG. 1 and FIG. 2, an embodiment of an integrated installation apparatus 100 is shown for positioning an electronics rack on a surface, such as a data center floor for example. The integrated installation apparatus 100 includes a mat 102 with guide members or guides 104 arranged substantially parallel to each other on the mat 102. A support structure, such as elongated members 106, is arranged on the mat 102 to distribute the rack's weight over a surface area of the mat 102. In an embodiment, the guides 104 also provide support and weight distribution properties. In other embodiments, additional support members may be positioned on the mat 102 to enhance weight distribution. In an embodiment, the elongated members 106 are substantially flat members of a selected thickness to support the rack. In one embodiment, the elongated members 106 are arranged substantially parallel to each other and substantially perpendicular to guides 104. After the rack is positioned in a selected position on the mat 102, the rolling members are elevated as the feet are lowered from the rack to support and secure the rack in place. Exemplary rack feet receptacles on the elongated members 106 are depicted by element 107. The guides 104 may be any suitable shape, such as an L-shaped cross-section similar to angle bars, to receive and guide the rack's rolling members. The guides 104 may also include support or reinforcement for distribution of the rack's weight. As depicted, the guides include a bottom portion 108 and a side portion 110 extending vertically from the bottom portion 108. In an embodiment, the rolling members roll along the bottom portion 108 and are guided by side portions 110 to position the rack properly on the mat 102. Stops 112 are located at the end of each guide 104 to prevent the rolling members from rolling off the guides 104. As depicted, the guides 104 and elongated members 106 are substantially perpendicular to one another. In embodiments, the support structure, including elongated members 104 and guides 104 may include any suitable number of members arranged in any suitable fashion to enable accurate positioning of the rack while providing structural support and weight distribution for the rack while protecting the mat 102. Further, the mat 102 is a durable protective member configured to protect the floor surface beneath the mat 102 from the weight of the rack installed on the apparatus.

Removable adapters 114 are connected to blocks 116 on the guides 104 to provide guidance as the rack rollers are received on a first side 115 of the mat 102. The adapters 114 may be any suitable shape and configuration, such as the L-shape cross-section, with a bottom portion 118 and a side portion 120. The adapters 114 include an angled portion 121 to receive the rack's rolling members at a range of angles and guide them to the guides 104. The adapters 114 may also include a ramped or tapered portion 122 to provide a flush surface transition to the mat 102 and enable rack movement onto the adapters 114. The integrated installation apparatus 100 also include key features 124 and 126 in the mats 102 to enable coupling to similar key features of adjacent integrated installation apparatus 100, as discussed below with reference to FIG. 5. The key features 124, 126 may be any suitable configuration and geometry to enable alignment and coupling between adjacent integrated installation apparatus 100.

The mat 102 may be made from any suitable durable hard material, such as but not limited to a plastic and/or rubber compound. In an embodiment, the mat 102 material protects the elevated floor from the rack and is coupled to the floor by a suitable mechanism, such as adhesives or fasteners. One embodiment of the mat 102 may be formed from a polycarbonate resin thermoplastic (e.g., Lexan®). The weight distribution structure, including elongated members 106, may be formed from a suitable structurally supportive material, such as but not limited to steel alloy, carbon fiber and/or plastic. In addition, the guides 104 may also be formed from a suitable structurally supportive material, such as but not limited to the following example materials, steel alloy, carbon fiber and/or plastic. In an embodiment, the guides 104 and elongated members 106 are coupled to the mat 102 by any suitable mechanism, such as but not limited to adhesives and/or fasteners. In another embodiment, the guides 104 and/or elongated members 106 are coupled to the mat 102 by being formed or molded as part of the mat 102 when the mat 102 is created from a material, such as a thermoplastic. In other embodiments, the guides 104 and/or elongated members 106 are coupled to the mat 102 after each part is formed or made. The removable adapters 114 may be formed from a suitable structurally supportive material, such as but not limited to steel alloy, carbon fiber and/or plastic.

Figure 3:
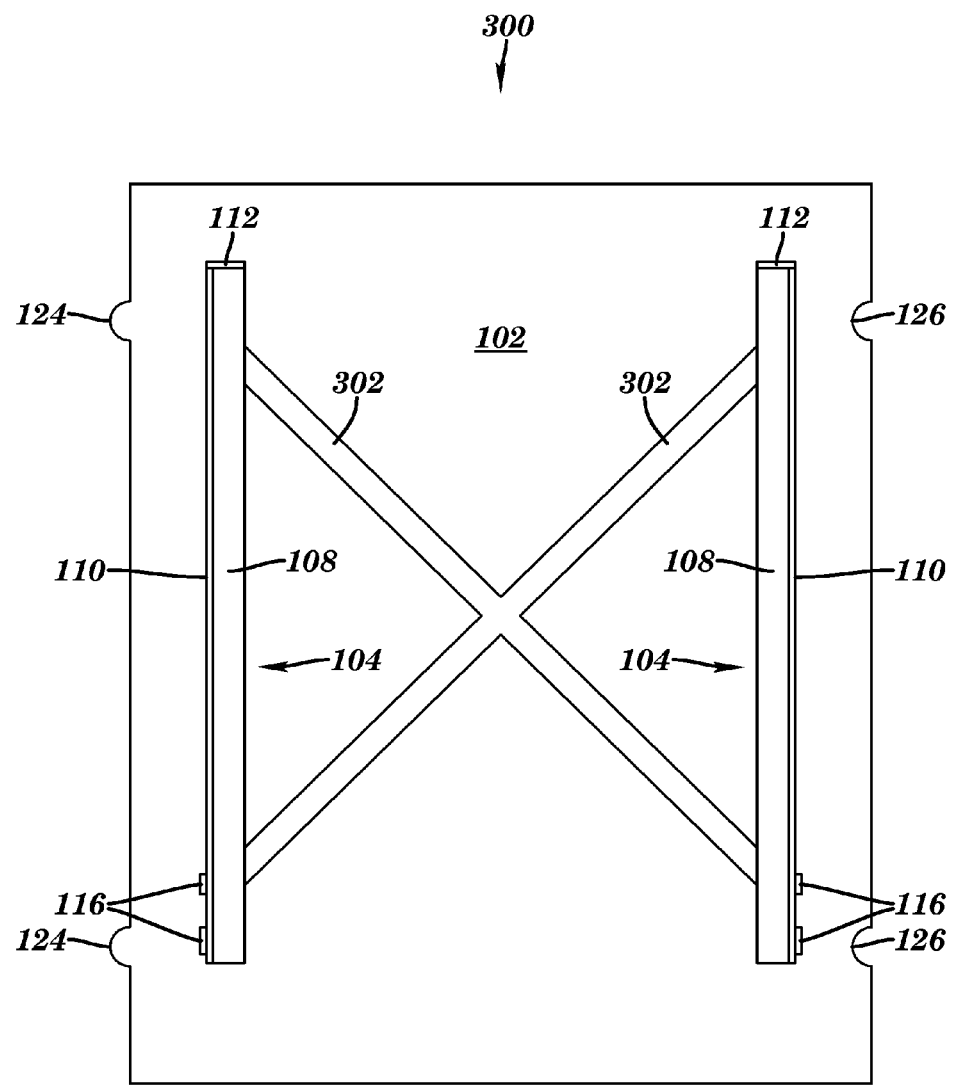
FIG. 3 is a top view of an integrated installation apparatus in accordance with another embodiment of the invention.
Figure 4:
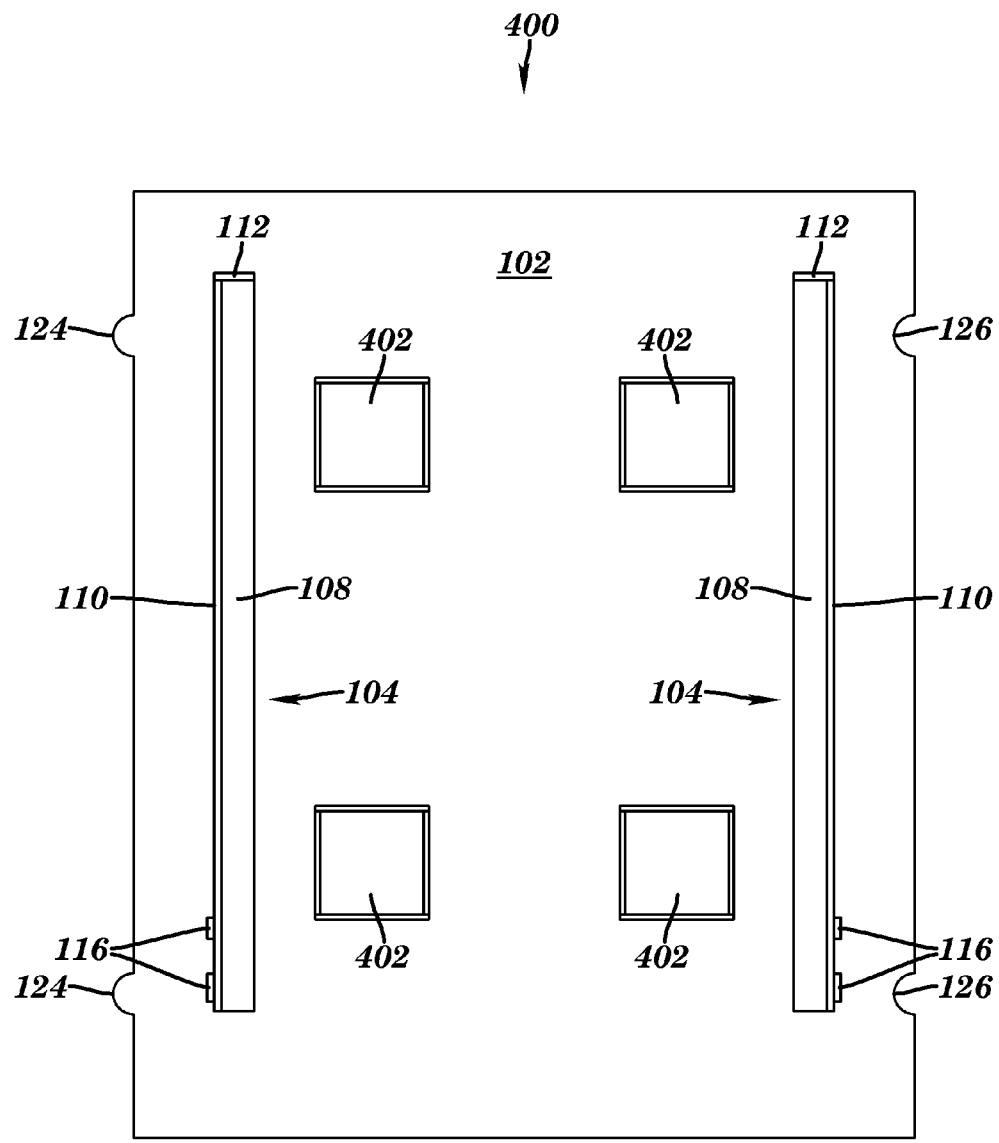
FIG. 4 is a top view of an integrated installation apparatus in accordance with yet another embodiment of the invention.

Referring now to FIG. 3, another embodiment of an integrated installation apparatus 300 is shown. The weight distribution structure includes elongated members 302 arranged in a cross or X-shaped pattern to distribute the rack's weight across a surface area of the mat 102. FIG. 4 is a top view of yet another embodiment of an integrated installation apparatus 400. As depicted, the integrated installation apparatus 400 includes a plurality of support pads 402 to distribute the rack's weight across the mat 102 surface area. The support pads 402 may be any suitable shape, such as but not limited to circles, squares, rectangles and other polygons. Support pads 402 may be made of any suitable structurally supportive material, such as but not limited to steel alloy, carbon fiber and/or plastic. Any number of support pads 402 may be used and arranged in a suitable fashion to protect the mat 102.

Figure 5:
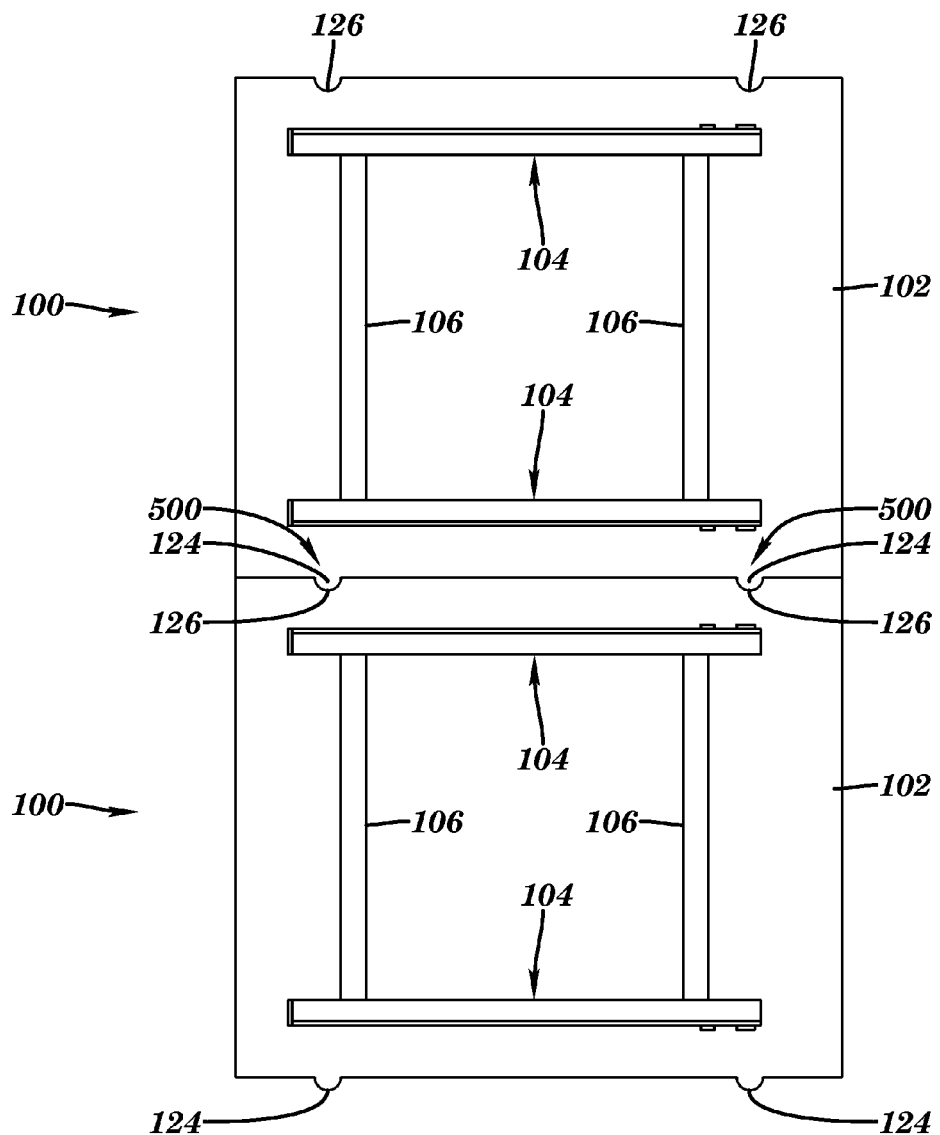
FIG. 5 is a top view of a plurality of the integrated installation apparatus shown in FIG. 1.

FIG. 5 is an illustration of a pair of exemplary integrated installation apparatus, such as apparatus 100 from FIG. 1, coupled together for positioning a pair of adjacent electronics racks on a floor of a data center. It is understood that any embodiment of the integrated installation apparatus discussed herein may be arranged and coupled together as shown. In an embodiment, the integrated installation apparatus 100 are coupled or joined together at connections 500 by key features 124 and 126 of each apparatus. In one embodiment, the guides 104 restrict movement of rolling members supporting the racks during installation, which enhances control and reduces unwanted movement of the rack during installation. The enhanced control and reduced movement may prevent damage to adjacent equipment, such as racks, during installation. In an embodiment, the integrated installation apparatus 100 are coupled together in the depicted fashion to form a row that provides simplified installation and precise positioning of the racks relative to each other along a row in the data center. A row of integrated installation apparatus 100 are arranged in a row and coupled as shown on an elevated floor of a data center, where a path of protective tiles are laid down to enable movement of the racks to each integrated installation apparatus 100. By providing the protection of the mat 102, weight distribution and support of elongated members 106 and/or guides 104 and positioning features of guides 104 in a single apparatus, rack installation is simplified and streamlined. Further, the guides 104 are arranged to control positioning and prevent damage during installation and/or replacement of racks.

Embodiments of the present invention provide an integrated installation apparatus for positioning electronics racks. Embodiments of the present invention provide protection for a floor surface integrated with features to simplify rack positioning and installation. Embodiments simplify electronics rack installation by providing a single apparatus to be placed on a desired installation location on a floor that enables precise positioning using guide features, protects adjacent racks, protects the floor with a durable mat and also allows for proper weight distribution via a support structure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An integrated installation apparatus to receive an electronics rack in a data center, the apparatus comprising:
   a mat comprising a hard material to protect a floor surface beneath the mat, wherein the mat has a key feature to couple to respective key features of adjacent mats, the key feature of the mat being one of a first plurality of integral male key features protruding from a side of the mat to be received in integral female key features of one of the adjacent mats and a second plurality of integral female key features recessed from an opposite side of the mat to be receptive of integral male key features of the other of the adjacent mats;
   a guide coupled to the mat to receive a rolling member supporting the electronics rack;
   a weight distribution structure configured to distribute a weight from feet that support the electronics rack to the mat, wherein the rolling member is configured to be elevated above a surface of the electronics rack; and
   a removable structure including substantially straight portions connected to form an obtuse angle to enable the guide to receive and position the rolling member during installation.

2. The apparatus of claim 1, further comprising a pair of substantially parallel guides to receive a plurality of rolling members supporting the electronics rack.

3. The apparatus of claim 1, wherein the mat comprises polycarbonate resin thermoplastic.

4. The apparatus of claim 1, wherein the weight distribution structure comprises a first pair of substantially parallel elongated members.

5. The apparatus of claim 1, wherein the weight distribution structure comprises a steel alloy.

6. An integrated installation apparatus to receive an electronics rack in a data center, the apparatus comprising:
   a mat comprising a hard material to protect a floor surface beneath the mat, wherein the mat has a key feature to couple to respective key features of adjacent mats, the key feature of the mat being one of a first plurality of integral male key features protruding from a side of the mat to be received in integral female key features of one of the adjacent mats and a second plurality of integral female key features recessed from an opposite side of the mat to be receptive of integral male key features of the other of the adjacent mats;
   a guide coupled to the mat to receive a rolling member supporting the electronics rack; and
   a weight distribution structure configured to distribute a weight from feet that support the electronics rack to the mat, wherein the rolling member is configured to be elevated above a surface of the electronics rack,
   wherein the guide comprises a pair of guides disposed in parallel with one another and the apparatus further comprises removable structures comprising a pair of adapters respectively received by sleeves on each of the pair of guides to enable the guides to receive and position the rolling member during installation.

7. The apparatus of claim 6, wherein the adapters each comprise:
   a parallel portion that is parallel with the other parallel portion and aligned with the corresponding guide; and
   an angled portion that is obtusely angled with respect to the corresponding parallel portion and the guide and away from the other angled portion with increasing distance from the guides.

8. The apparatus of claim 7, wherein the angled portions each comprise a ramped portion to provide a flush surface transition to the mat.

* * * * *